United States Patent
Yang et al.

(10) Patent No.: US 9,276,001 B2
(45) Date of Patent: Mar. 1, 2016

(54) SEMICONDUCTOR DEVICE AND METHOD FOR MANUFACTURING THE SAME

(75) Inventors: Guangjun Yang, Meridian, ID (US); Russell Benson, Boise, ID (US)

(73) Assignee: NANYA TECHNOLOGY CORPORATION, Tao-Yuan Hsien (TW)

(*) Notice: Subject to any disclaimer, the term of this patent is extended or adjusted under 35 U.S.C. 154(b) by 0 days.

(21) Appl. No.: 13/479,192

(22) Filed: May 23, 2012

(65) Prior Publication Data

US 2013/0313702 A1    Nov. 28, 2013

(51) Int. Cl.
*H01L 23/498* (2006.01)
*H01L 21/768* (2006.01)
*H01L 27/108* (2006.01)

(52) U.S. Cl.
CPC .... *H01L 27/10808* (2013.01); *H01L 27/10885* (2013.01); *H01L 27/10891* (2013.01); *H01L 27/10888* (2013.01)

(58) Field of Classification Search
CPC ............................. H01L 23/498; H01L 21/768
USPC ............................. 257/737, 332, 204, 68–71
See application file for complete search history.

(56) References Cited

U.S. PATENT DOCUMENTS

| | | | | |
|---|---|---|---|---|
| 5,849,635 | A * | 12/1998 | Akram et al. | 438/704 |
| 7,851,354 | B2 * | 12/2010 | Seo et al. | 438/634 |
| 7,851,842 | B2 * | 12/2010 | Cho | 257/302 |
| 2005/0029627 | A1 * | 2/2005 | Dennison | H01L 27/2427 257/618 |
| 2006/0244024 | A1 * | 11/2006 | Manger et al. | 257/296 |
| 2007/0066018 | A1 * | 3/2007 | Park et al. | 438/268 |
| 2008/0111182 | A1 * | 5/2008 | Irani et al. | 257/324 |
| 2009/0004810 | A1 * | 1/2009 | Kim | 438/399 |
| 2009/0242972 | A1 * | 10/2009 | Cho | 257/329 |
| 2010/0032743 | A1 * | 2/2010 | Huang et al. | 257/306 |
| 2010/0133609 | A1 * | 6/2010 | Gilgen et al. | 257/330 |
| 2010/0330775 | A1 * | 12/2010 | Shin | H01L 21/743 438/430 |
| 2011/0014574 | A1 * | 1/2011 | Tran | 430/315 |
| 2011/0156118 | A1 * | 6/2011 | Park | 257/306 |
| 2012/0119276 | A1 | 5/2012 | Chuang et al. | |

FOREIGN PATENT DOCUMENTS

| | | |
|---|---|---|
| CN | 101546731 | 9/2009 |
| TW | 200516759 | 5/2005 |
| TW | 201007930 | 2/2010 |

OTHER PUBLICATIONS

Office Action issued on Dec. 11, 2014 by Taiwan Intellectual Property Office for Taiwan application # 102116320. Nanya Technology Corporation.
Office Action issued by SIPO, China for case 201310192035.5 on May 26, 2015.
Search report for Office Action issued by SIPO, China for case 201310192035.5 dated Apr. 30, 2015.

* cited by examiner

*Primary Examiner* — Marc Armand
*Assistant Examiner* — Quinton Brasfield
(74) *Attorney, Agent, or Firm* — Ming Chow; Sinorica, LLC

(57) ABSTRACT

A semiconductor device comprises a substrate, a word line, an insulation material, and an etch stop material. The substrate comprises a pillar that may comprise an active area. The word line is formed in the substrate. The insulation material is formed on the word line. The etch stop material is formed on the insulating material and around the pillar.

12 Claims, 13 Drawing Sheets

SEMICONDUCTOR DEVICE AND METHOD FOR MANUFACTURING THE SAME

BACKGROUND OF THE INVENTION

1. Technical Field

The present invention relates to a semiconductor device and a method for manufacturing a semiconductor device.

2. Background

Memory devices storing information such as digital information are commonly used in electronic apparatuses. DRAMs, one type of memory device, typically comprise millions of identical circuit elements, known as memory cells, which can be charged to a voltage representative of a digital data value.

FIG. 1 depicts a schematic diagram of a conventional DRAM memory cell 10. The memory cell 10 has a capacitor 12 and a transistor 14. The capacitor 12 can store charge, which represents one bit of information. The transistor 14 acts as a switch, which controls the flow of charge in or out of the capacitor 12. The control gate of the transistor 14 is coupled to a word line 16, and the drain of the transistor 14 is coupled to a digit line 18. When a cell is read, the transistor 14 is activated through the word line 16, and the charge in the capacitor 12 can be detected by a sense amplifier through the digit line 18 and processed to determine the bit state of the cell 10. Arranging a plurality of cells 10 together, such that the cells 10 along a given digit line 18 do not share a common word line 16 and the cells 10 along a word line 16 do not share a common digit line 18, forms a memory array. A typical memory array contains thousands or millions of cells.

As the size of memory devices decreases, the components of the devices become smaller and/or denser for a given storage capacity. Small DRAMs can be formed using a buried word line technology. Such technology generally forms a trench, and a word line is then formed in the trench. Oxide is usually applied to isolate the word line. Subsequently, digit lines are formed and an insulating layer is etched to form a plurality of cell contact holes. Conventionally, the oxide isolating the word line is not properly protected; therefore, the oxide may be damaged, or keyholes or etched holes may be formed on the oxide during an etch process.

SUMMARY

One embodiment discloses a semiconductor device, which comprises a substrate, a word line, an insulation material, and an etch stop material. The substrate comprises a pillar that may comprise an active area. The word line is formed in the substrate. The insulation material is formed on the word line. The etch stop material is formed on the insulating material and around the pillar.

Another embodiment discloses a semiconductor device, which comprises a substrate, a plurality of word lines, an insulation material, and an etch stop material. The substrate comprises a plurality of active area pillars. The plurality of word lines are formed in the substrate. The insulation material covers the plurality of word lines. The etch stop material caps the insulation material and is formed to expose the pillar top surfaces of the active area pillars.

One embodiment discloses a method of manufacturing a semiconductor device. The method comprises forming a plurality of first trenches in a substrate, filling a first insulation material in the first trenches, forming a plurality of second trenches in the substrate wherein the first trenches and the second trenches define a plurality of pillars each comprising an active area, forming a word line in each second trench, filling a second insulation material in the second trench, recessing the first and second insulation material to form a recess, and depositing etch stop material to cover the recess.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Embodiments below illustratively, but not exclusively, demonstrate means for protecting the layer isolating word lines with reference to the drawings.

Figure 1:
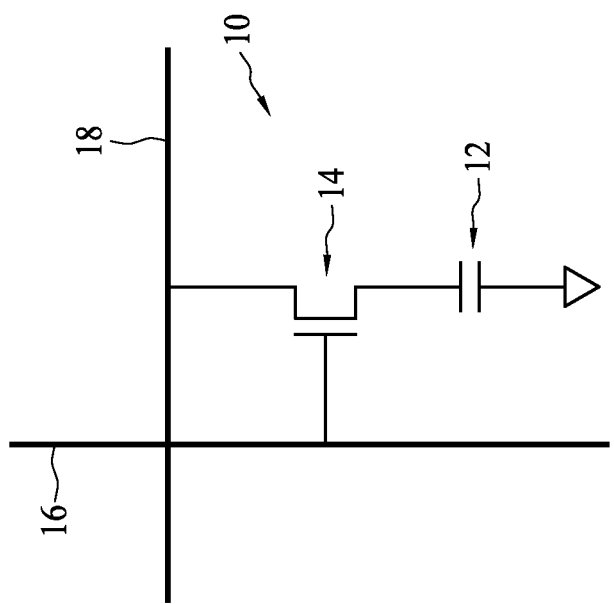
FIG. 1 depicts a schematic diagram of a conventional DRAM memory cell.
Figure 2:
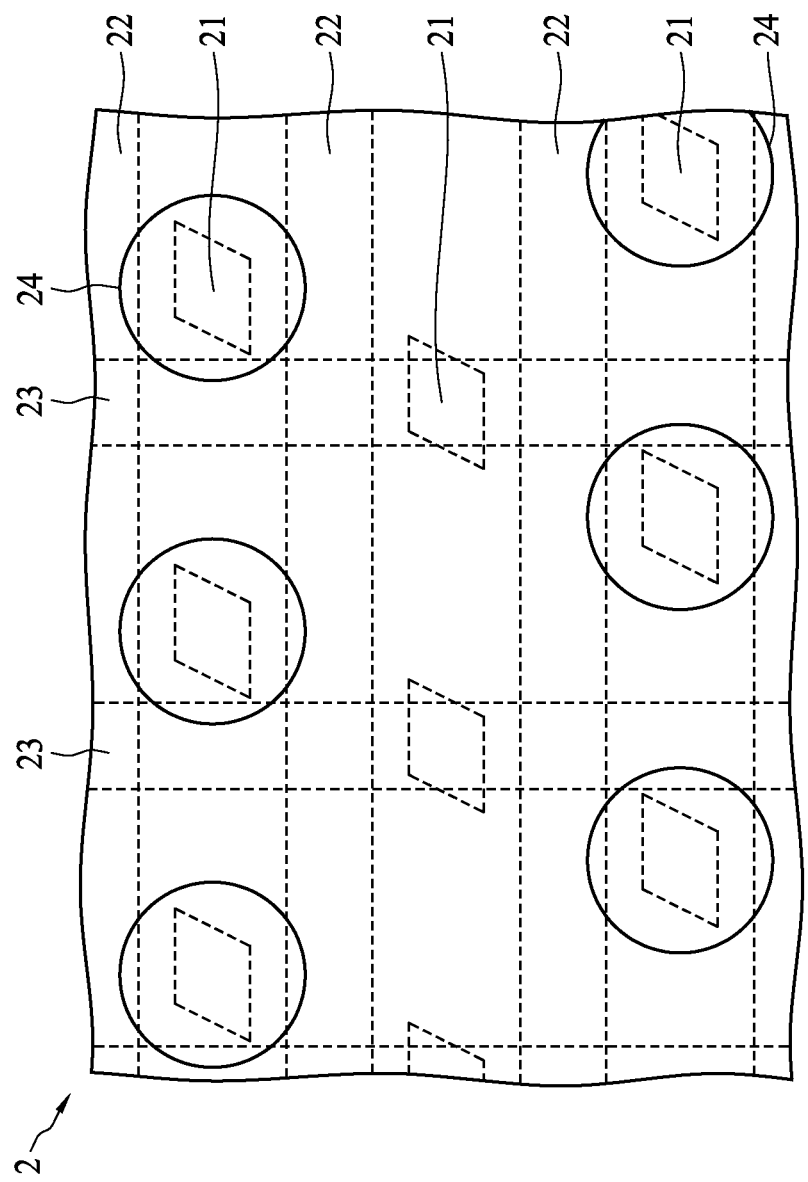
FIG. 2 schematically depicts the top view of a semiconductor device according to one embodiment.

FIG. 2 schematically depicts the top view of a semiconductor device 2 according to one embodiment. As shown in FIG. 2, the semiconductor device 2 comprises a plurality of active areas 21, a plurality of word lines 22 formed between corresponding active areas 21, a plurality of bit lines 23 coupled to a portion of active areas 21, and a plurality of capacitors 24 coupled with other portions of active areas 21. An embodiment of a method for manufacturing the semiconductor device 2 is described below with reference to FIGS. 3 to 12.

Figure 3:
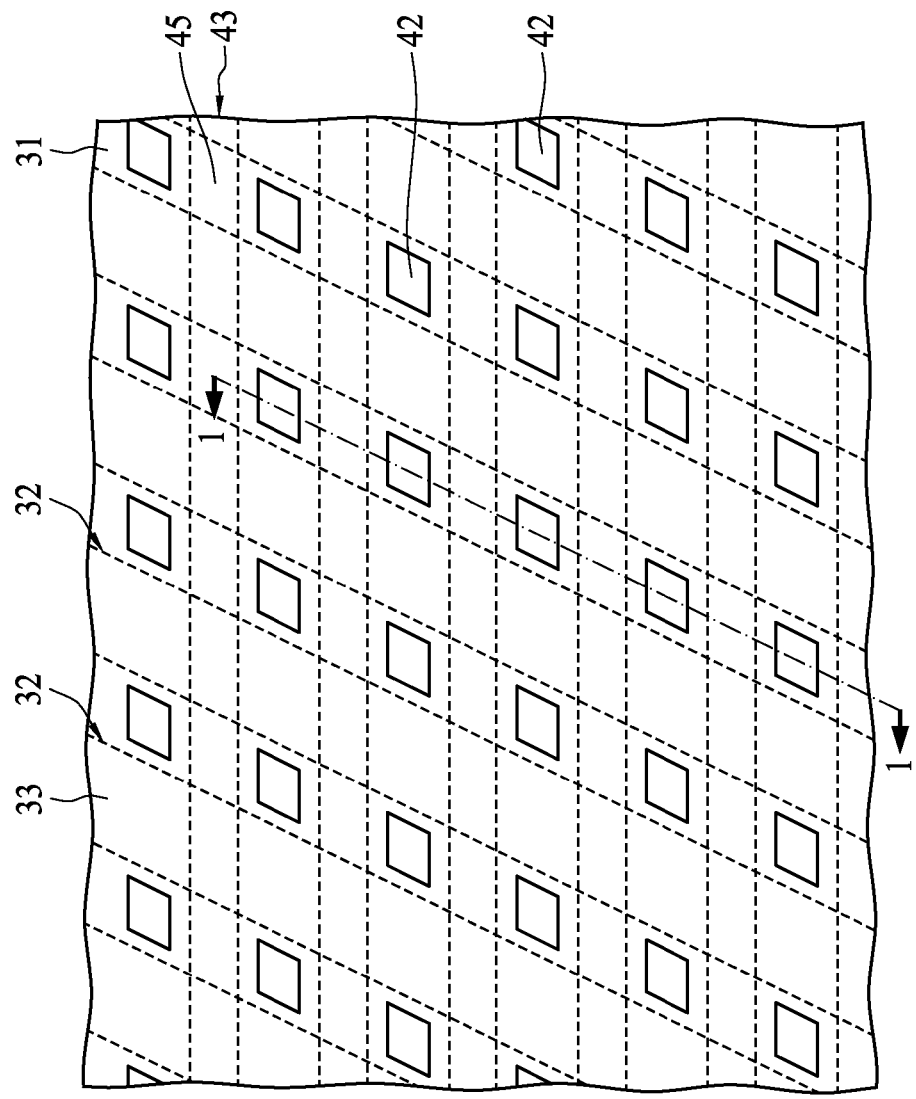
FIG. 3 is a top view of a substrate demonstrated for explaining some steps in the embodiment of a method for manufacturing the semiconductor device.
Figure 4:
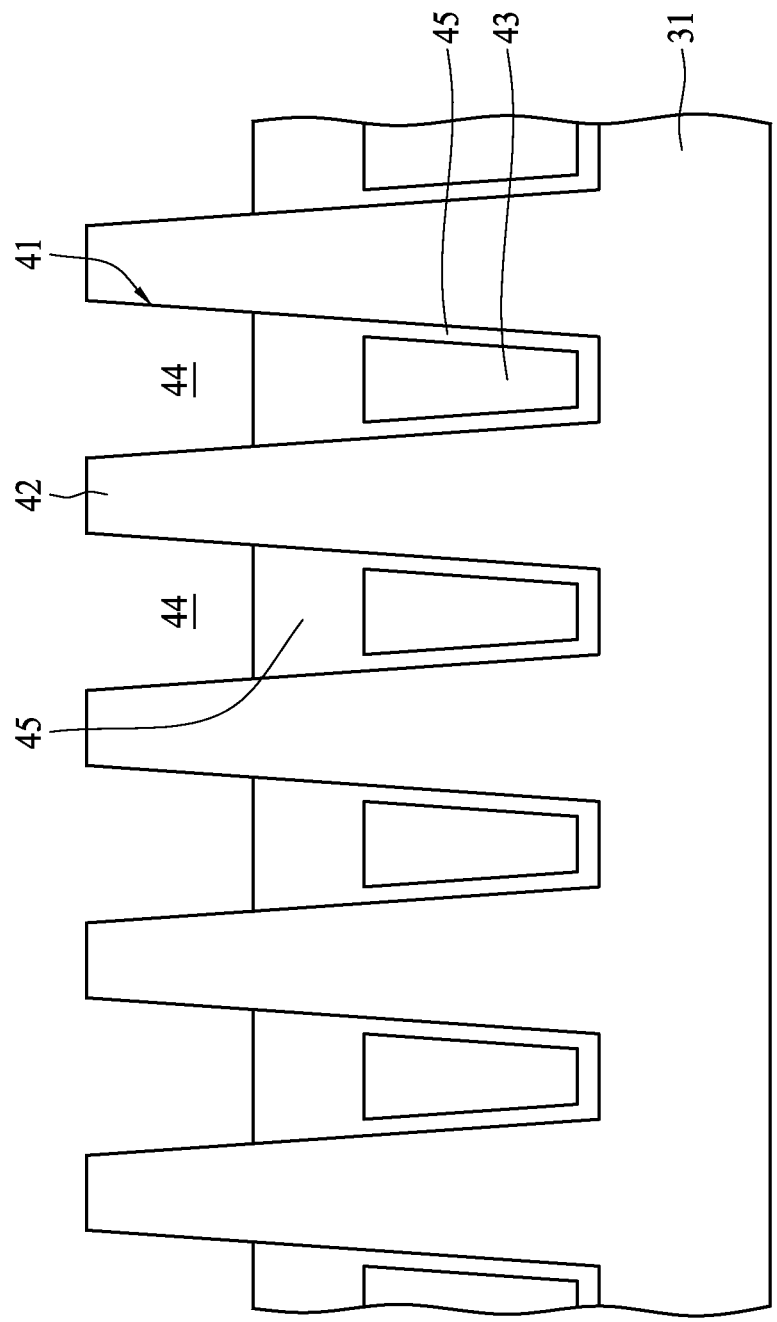
FIG. 4 is a cross-sectional view along line 1-1 of FIG. 3.

FIG. 3 is a top view of a substrate depicting some steps in the embodiment of a method for manufacturing the semiconductor device 2. FIG. 4 is a cross-sectional view along line 1-1 of FIG. 3. As shown in FIG. 3, the process begins with providing a substrate 31, which may comprise silicon substrate or other substrates suitable as a base for forming the semiconductor device 2. In some embodiments, the substrate 31 can be initially processed to include a layer of first conductivity type (e.g., n-type), a layer of second conductivity type (e.g., p-type) on the layer of first conductivity type, and a layer of another first conductivity type (e.g., n+type) on the layer of second conductivity type.

A plurality of isolation trenches 32 are formed on the substrate 31 by lithographic processes. In some embodiments, the lithographic processes comprise spacer-based patterning techniques. The isolation trenches 32 may be generally straight and generally parallel to one another. The isolation trenches 32 may be formed by a dry etch or other suitable etch process. The isolation trenches 32 may be formed with generally vertical and/or slightly sloping sidewalls. The isolation trenches 32 are then filled with suitable insulation material 33 such as silicon dioxide. In some embodiments, the insulation material 33 may be a spin-on dielectric.

As shown in FIG. 4, a plurality of trenches 41 are next formed on the substrate 31 by lithographic processes. In some embodiments, the lithographic processes comprise spacer-based patterning techniques. The trenches 41 may be generally straight and generally parallel to one another. The trenches 41 may be formed by a dry etch or other suitable etch process. The trenches 41 may be formed with generally vertical and/or slightly sloping sidewalls. The isolation trenches 32 and the trenches 41 together define a plurality of pillars 42 each comprising an active area in the substrate 31.

Referring to FIG. 4, insulation material 45 such as silicon dioxide is formed on sidewalls and bottoms of the trenches 41 via deposition or other suitable processes. Conductive material 43 such as tungsten, titanium nitride, tungsten nitride, or other suitable material may be deposited by suitable processes, and then recessed to a desired depth. The remaining conductive material 43 in the trenches 41 forms the word lines, which are between corresponding active area pillars 42 or adjacent to corresponding active area pillars 42. Thereafter, insulation material 45 is deposited to cover the remaining conductive material 43 by suitable processes. The insulation material 33 and 45 are then recessed to a depth measured from the pillar top surface 421 via a wet or dry etch process to form a recess 44, where the upper portions of the pillars 42 protrude.

Figure 5:
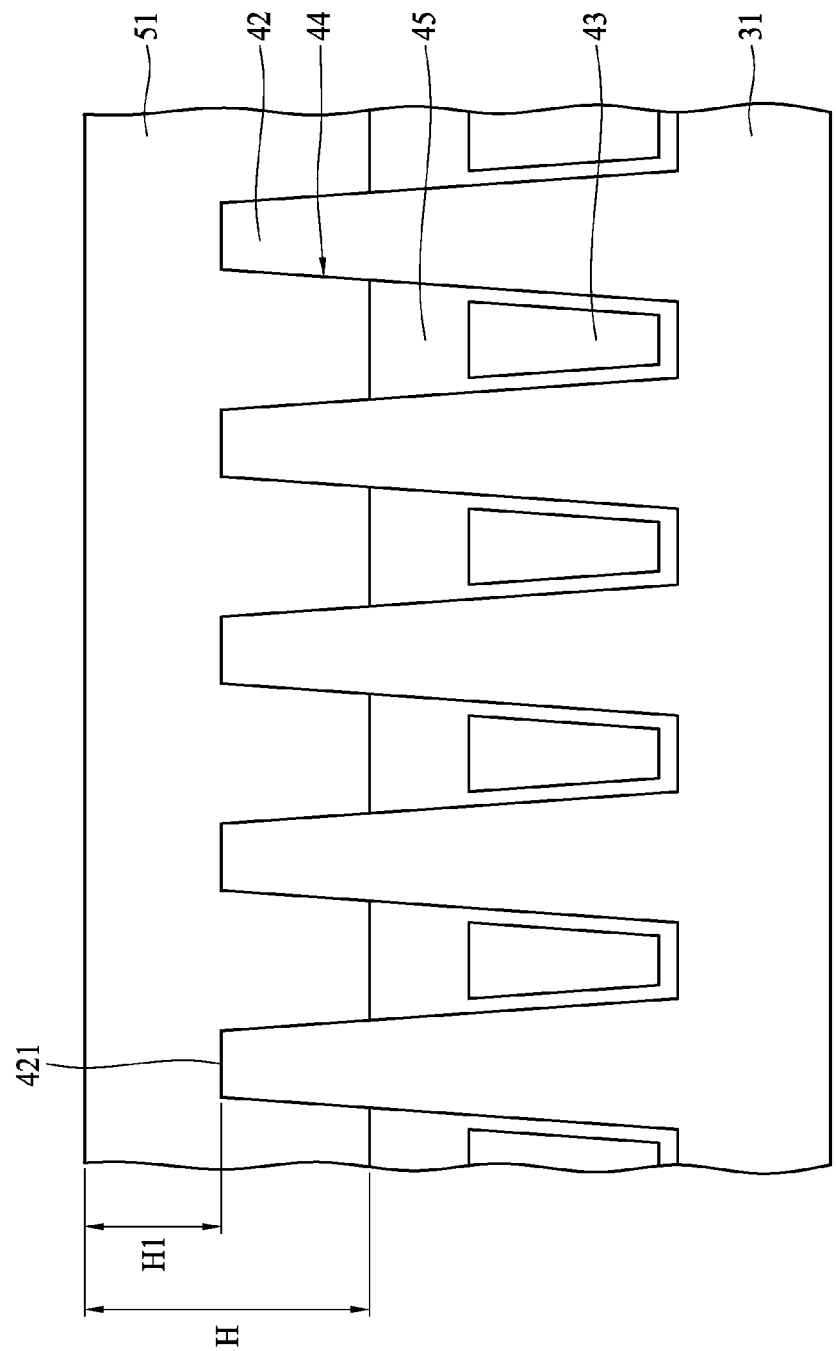
FIG. 5 is a cross-sectional view used for illustrating some other steps in the embodiment of a method for manufacturing the semiconductor device.

FIG. 5 is a cross-sectional view illustrating other steps in the embodiment of a method for manufacturing the semiconductor device 2. An etch stop material 51 is deposited, filling the recess 44 and covering the pillars 42 by suitable processes. In some embodiments, the total thickness H of the etch stop material 51 is about 1.5 to 2 times the thickness H1 of the portion of the etch stop material 51 above the pillar top surfaces 421 of the pillars 42. Furthermore, the etch stop material 51 is generally used to protect the insulation material 45 from damage during subsequent etch processes. The etch stop material 51 may comprise nitride; however, other suitable material that can be used to protect the insulation material 45 during later etch processes can also be applied.

Figure 6:
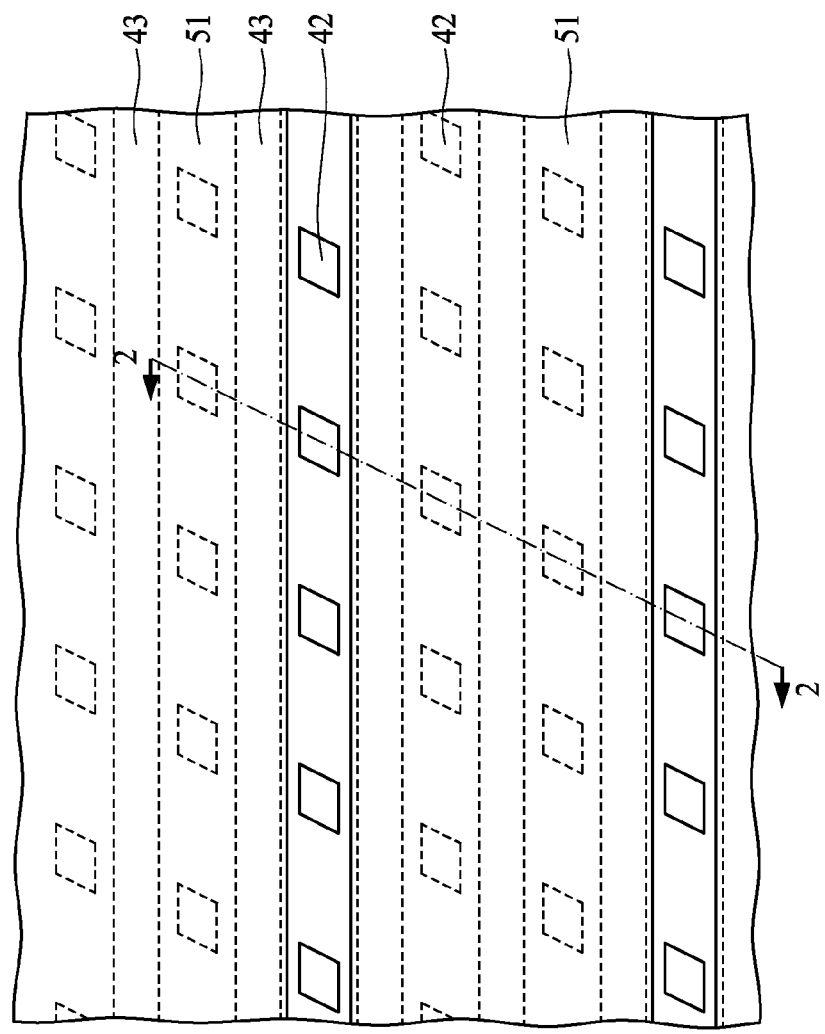
FIG. 6 is a top view depicting other steps in the embodiment of a method for manufacturing the semiconductor device.
Figure 7:
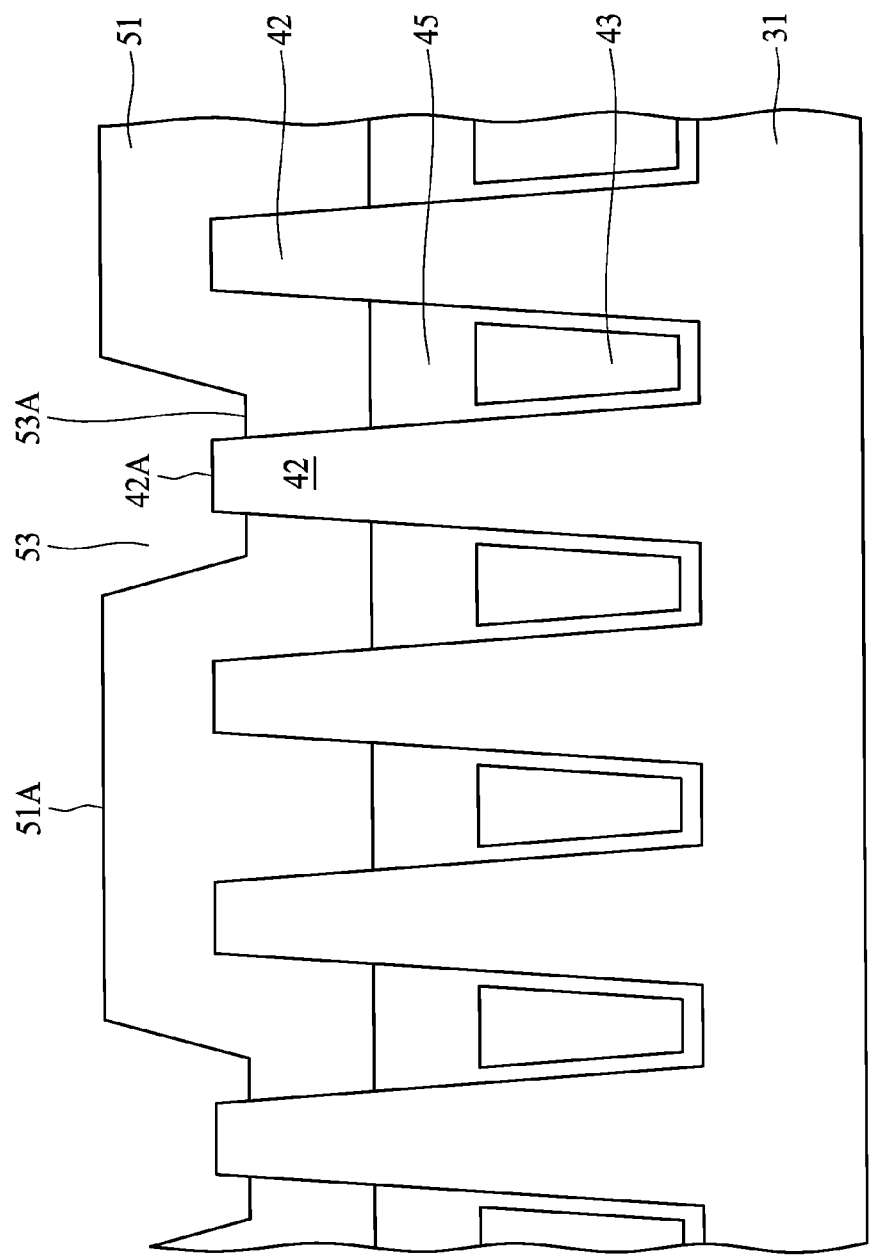
FIG. 7 is a cross-sectional view along line 2-2 of FIG. 6.

FIG. 6 is a top view depicting other steps in the embodiment of a method for manufacturing the semiconductor device 2. FIG. 7 is a cross-sectional view along line 2-2 of FIG. 6. Referring to FIGS. 6 and 7, the etch stop material 51 is patterned, by lithographic processes, to expose the active areas of the pillars 42 used as contacts for digit lines. As can be seen in FIG. 7, portions of the etch stop material 51 are removed to expose the active areas of a portion of the pillars 42 by lithographic processes or suitable processes. The portions of the etch stop material 51 may even be removed such that the remaining etch stop material 51 is recessed below the active areas of the pillars 42. The remaining etch stop material 51 is still around the corresponding pillars 42. In some embodiments, a plurality of strips of etch stop material are removed to expose the active areas of the pillars 42. In some embodiments, the removed strip of etch stop material extends parallel to the extension direction of the conductive material 43. Removing a portion of the etch stop material 51 forms a recess 53, a bottom 53A of the recess 53 is lower than an upper surface 42A of the pillar 42, and a top 51A of the etch stop material 51 is higher than the upper surface 42A of the pillar 42.

Figure 8:
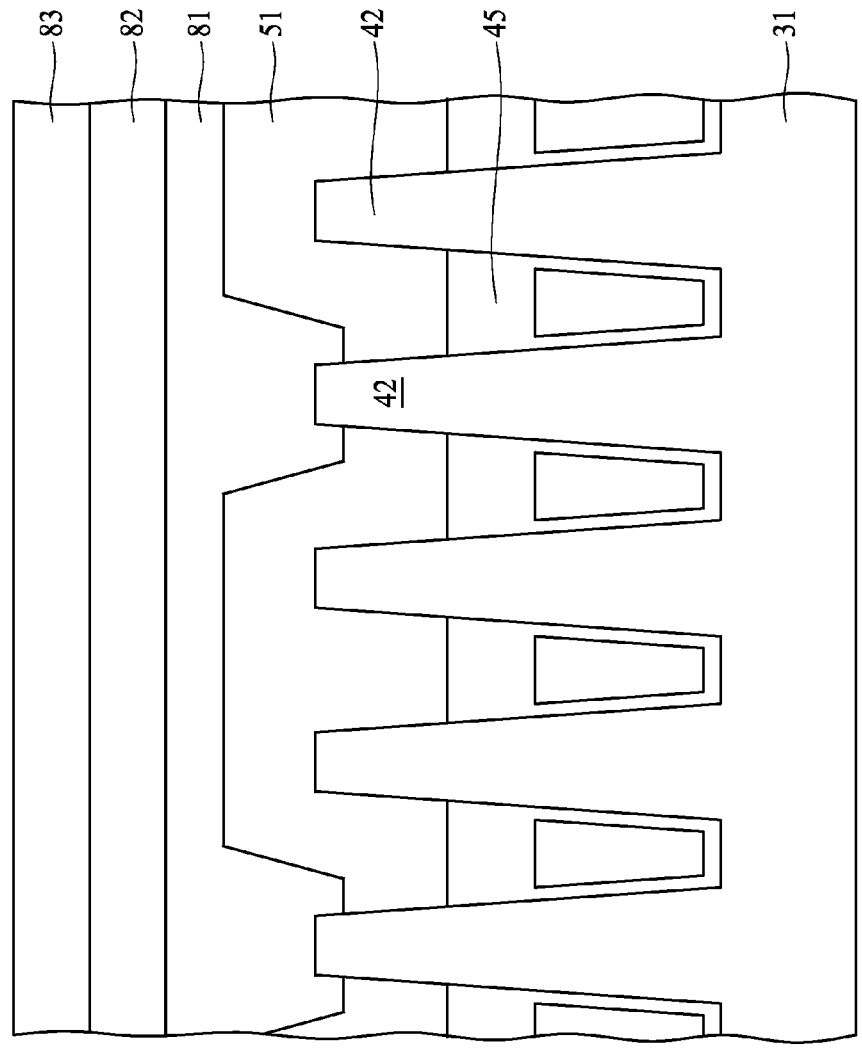
FIG. 8 is a cross-sectional view depicting other steps in the embodiment of a method for manufacturing the semiconductor device.

FIG. 8 is a cross-sectional view depicting other steps in the embodiment of a method for manufacturing the semiconductor device 2. Material used for forming digit lines is deposited. Any suitable material can be applied to form digit lines in the method for manufacturing the semiconductor device 2. In some embodiments, a polysilicon layer 81, a metal layer 82 and a cap layer 83 are sequentially deposited through suitable processes for forming digit lines.

Figure 9:
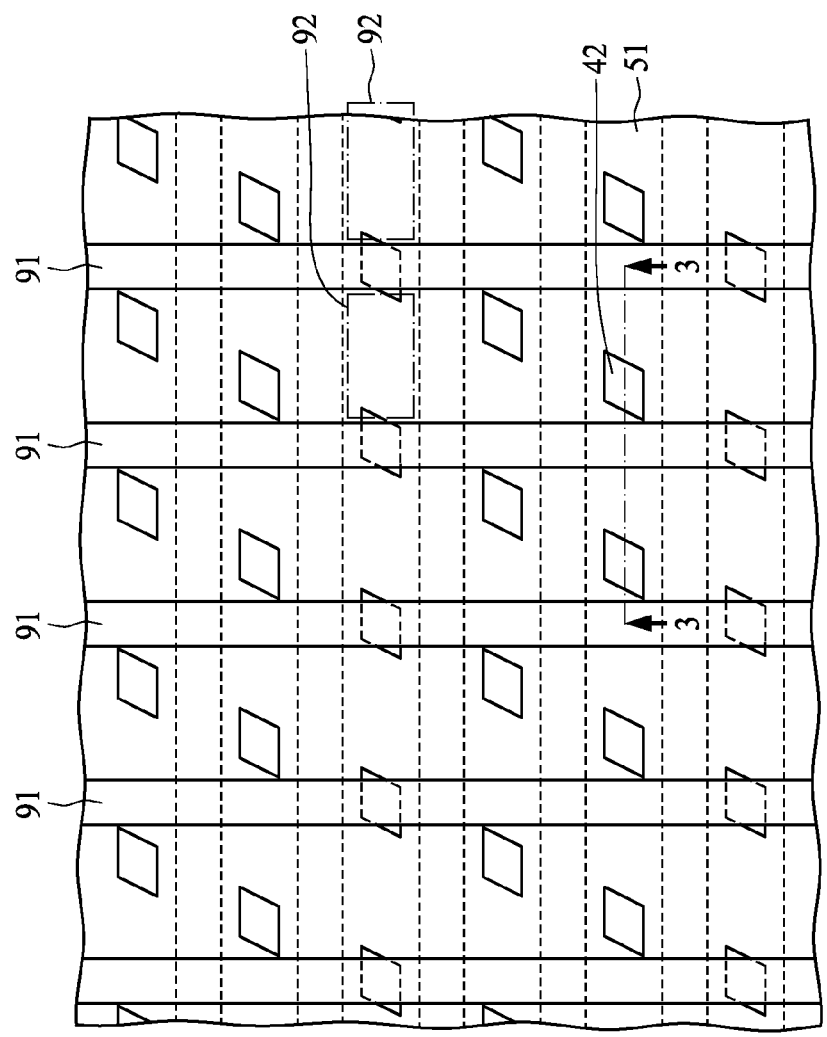
FIG. 9 is a top view depicting other steps in the embodiment of a method for manufacturing the semiconductor device.
Figure 10:
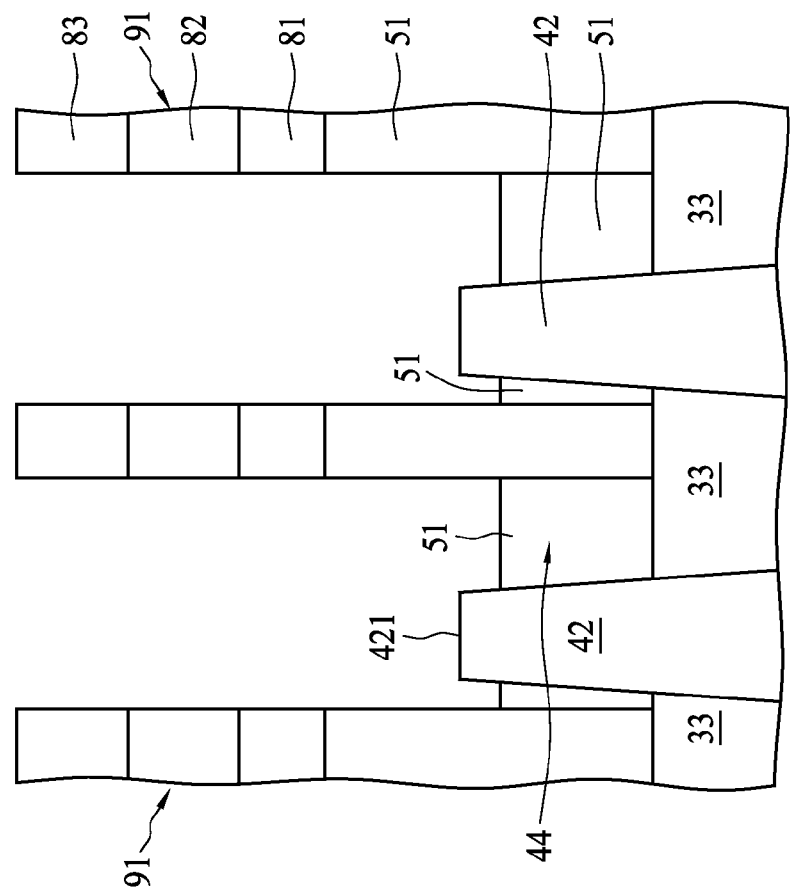
FIG. 10 is a cross-sectional view along line 3-3 of FIG. 9.

FIG. 9 is a top view depicting other steps in the embodiment of a method for manufacturing the semiconductor device 2. FIG. 10 is a cross-sectional view along line 3-3 of FIG. 9. As shown in FIGS. 9 and 10, in some embodiments, the polysilicon layer 81, the metal layer 82 and the cap layer 83 are patterned to form a plurality of digit lines 91 by lithographic processes or suitable processes. Each digit line 91 is coupled with a column of the active areas. The portion of the etch stop material 51 above the corresponding pillars 42 and between two adjacent digit lines 91 may be at least partially removed. In some embodiments, the portion of the etch stop material 51 between two adjacent digit lines 91 is partially removed such that the active areas of the corresponding pillars 42 are partially exposed. In some embodiments, the active areas of the corresponding pillars 42 between two adjacent digit lines 91 are completely exposed, and the remaining etch stop material 51 is recessed into the recess 44 and around the corresponding pillars 42. In particular, the recessing process on the portion of the etch stop material 51 between two adjacent digit lines 91 may further reduce the thickness of the remaining etch stop material 51 between the pillars 42 contacting the digit lines 91 (in regions 92 as shown in FIG. 9). As such, the etch stop material 51 in regions 92 is lower than the other parts of the remaining etch stop material 51 in regions between two adjacent digit lines 91.

As can be seen in FIG. 10, the etch stop material 51 around each pillar 42 has a plurality of portions having different heights. Around the pillar 42 in FIG. 10, a portion of the etch stop material 51 is lower than the pillar top surface 421, and a portion of etch stop material 51 is higher than the pillar top surface 421. In the present embodiment, the portion of etch stop material 51 under the digit line 91 is higher than the pillar top surface 421.

Figure 11A:
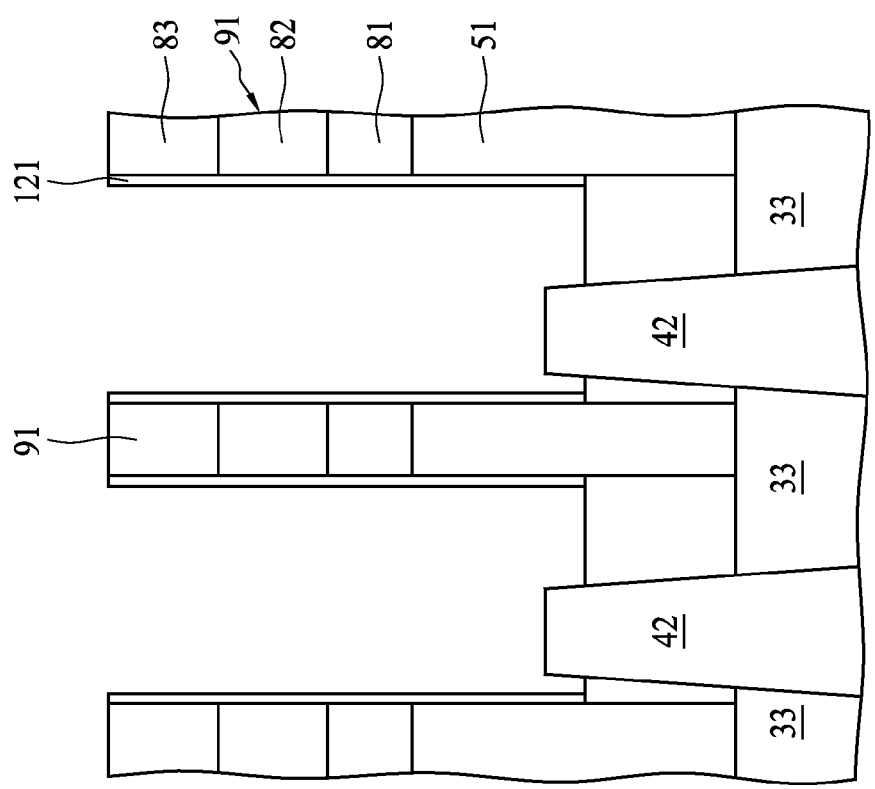
FIGS. 11A and 11B are cross-sectional views depicting other steps in the embodiment of a method for manufacturing the semiconductor device.
Figure 11B:
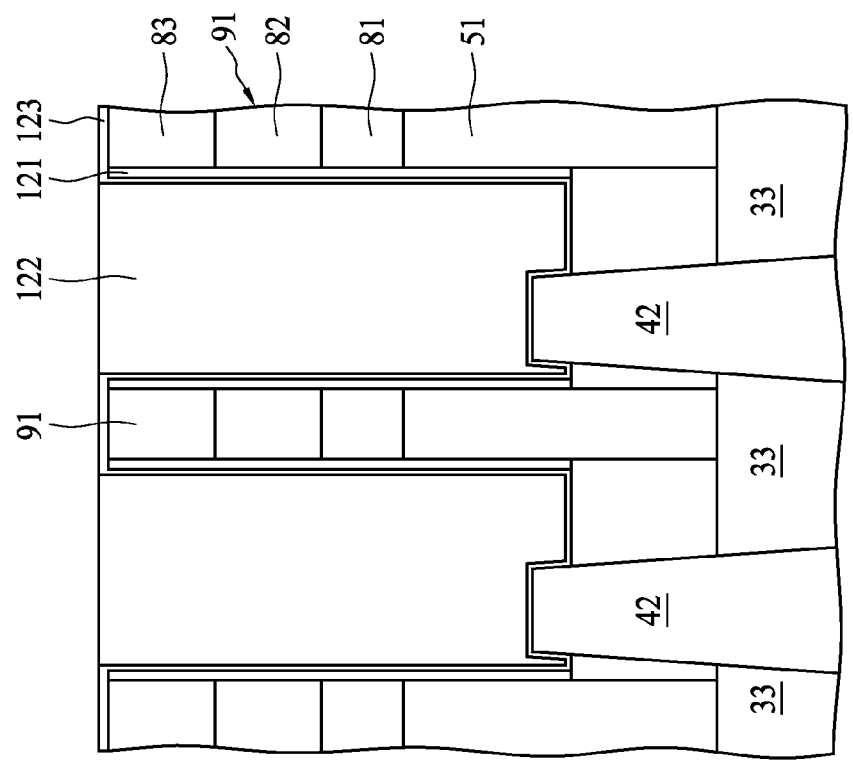

FIGS. 11A and 11B are cross-sectional views depicting other steps in the embodiment of a method for manufacturing the semiconductor device 2. As shown in FIG. 11A, after the digit lines 91 are formed, spacers 121 are formed on the digit lines 91 by suitable processes. The spacers 121 can be formed by deposition of spacer material, and the portions of the spacer material on the cap layer 83 and the bottoms of the spaces between the digit lines 91 are then removed by a removal process such as an etch process. The spacers 121 may comprise an etch stop material. In some embodiments, the spacers 121 may comprise nitride. Next, as shown in FIG. 11B, a liner layer 123 is optionally deposited after the formation of the spacers 121. The liner layer 123 may comprise dielectric material. In some embodiments, the liner layer 123 are formed sufficiently thin such that the subsequent material deposition or etch processes are not affected. Subsequently, dielectric material 122 is filled in the spaces between the digit lines 91, covering the pillars 42 between the digit lines 91. The dielectric material 122 may be applied by deposition, spin-coating or other suitable processes. The dielectric material 122 may comprise silicon oxide or other suitable material.

Figure 12:
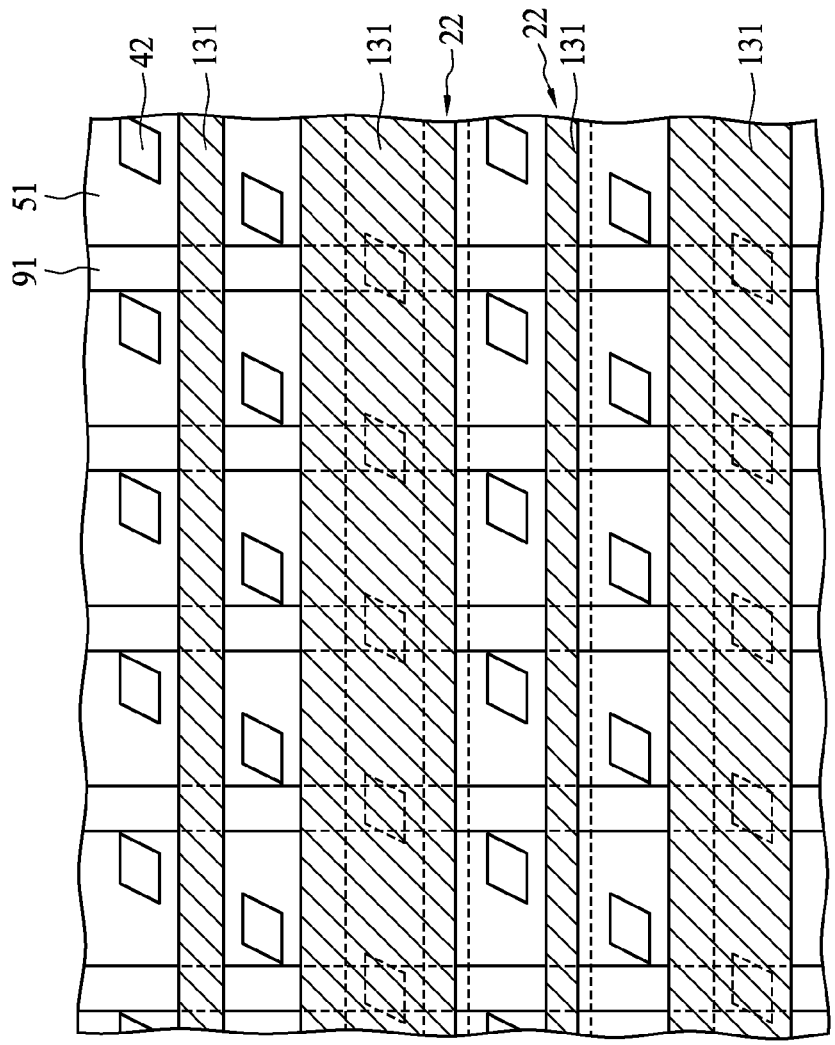
FIG. 12 is a top view depicting other steps in the embodiment of a method for manufacturing the semiconductor device.

FIG. 12 is a top view depicting other steps in the embodiment of a method for manufacturing the semiconductor device 2. As shown in FIG. 12, a mask 131 is applied to etch a portion of the dielectric material 122 between the digit lines 91 to expose the active areas of the corresponding pillars 42. The mask 131 can have a line and space pattern as shown in FIG. 12. As can be seen in FIG. 12, in the present embodiment, portions of insulation material 33 in the isolation trenches 32 are not covered by the mask 131, and portions of the etch stop material 51 above word lines 22 may not be covered by the mask 131. A suitable etchant may be applied to selectively etch the portion of the dielectric material 122 that is not covered by the mask 131 over the etch stop material 51 and/or the spacers 121 shown in FIG. 11. The contact etch process will be stopped by the etch stop material 51. Due to the etch stop material 51, the insulation material 45 and the portions of the insulation material 33 in the isolation trenches 32 can be protected from being damaged by the contact etch process so that electric short between contacts and word lines 22 will not occur and the insulation material 33 in the isolation trenches 32 will not be thinned down or broken through, causing device degradation.

In some other embodiments, a different mask having a plurality of through holes corresponding to the pillars 42 between the digit lines 91 can be used to expose the active areas of the pillars 42.

After the active areas of the pillars 42 between the digit lines 91 are exposed, capacitor elements can be formed and connected to the exposed active areas.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate comprising at least two first pillars and at least two second pillars between the two first pillars;
    a word line formed in the substrate between one of the at least two first pillars and one of the at least two second pillars;
    an insulation material formed on the word line;
    a digit line formed on an etch stop material;
    the etch stop material formed on the insulating material and around the pillar, wherein the etch stop material comprises at least two recesses and at least one protrusion between the at least two recesses, and a bottom of the recess is lower than an upper surface of the pillar;
    the protrusion covers the entire upper surface of the two second pillars between the two first pillars;
    the recess exposes the upper surface of the first pillar;
    the insulation material comprises silicon dioxide; and
    the etch stop material comprises nitride.

2. The semiconductor device of claim 1, wherein the etch stop material comprises a top higher than the upper surface of the pillar.

3. A semiconductor device comprising:
    a substrate comprising a at least two first pillars and at least two second pillars between the two first pillars;
    a word line formed in the substrate between one of the at least two first pillars and one of the at least two second pillars, an insulation material formed on the word line;
    a digit line formed on an etch stop material;
    the etch stop material formed on the insulating material;
    an insulation material covering the plurality of word lines;
    the etch stop material capping the insulation material, formed to expose pillar top surfaces of the active area pillars, wherein the etch stop material comprises at least two recesses and at least one protrusion between the at least two recesses, and a bottom of the recess is lower than an upper surface of the pillar, and the protrusion covers the entire upper surface of the two second pillars between the two first pillars; and
    the recess exposes the upper surface of the pillar.

4. The semiconductor device of claim 3, further comprising a digit line formed on the etch stop material.

5. The semiconductor device of claim 3, wherein the etch stop material comprises nitride.

6. The semiconductor device of claim 3, wherein the insulation material comprises silicon dioxide.

7. The semiconductor device of claim 3, wherein the etch stop material comprises a top higher than the upper surface of the pillar.

8. A method of manufacturing a semiconductor device, comprising the steps of:
    forming a plurality of first trenches in a substrate;
    filling a first insulation material in the first trenches;
    forming a plurality of second trenches in the substrate, wherein the first trenches and the second trenches define at least two first pillars and at least two second pillars between the two first pillars each comprising an active area;
    forming a word line in each second trench between one of the at least two first pillars and one of the at least two second pillars;
    filling a second insulation material in the second trench on the word line;
    recessing the first and second insulation material to form a recess;
    depositing etch stop material on the insulating material to cover the recess; and
    removing a portion of the etch stop material such that the etch stop material comprises at least two recesses and at least one protrusion between the at least two recesses, and a bottom of the recess is lower than an upper surface of the pillar, and the protrusion covers the entire upper surface of the two second pillars between the two first pillars; wherein the recess exposes the upper surface of the first pillar;

forming a digit line on the etch stop material.

9. The method of claim 8, further comprising the steps of:

filling dielectric material in spaces between the plurality of digit lines; and selectively etching the dielectric material over the etch stop material to expose the pillars between the plurality of digit lines.

10. The method of claim 8, wherein the etch stop material comprises nitride.

11. The method of claim 8, wherein the first or second insulation material comprises silicon dioxide.

12. The method of claim 8, wherein a thickness of the etch stop material is 1.5 to 2 times a thickness of a portion of the etch stop material above one of the pillars.

* * * * *